United States Patent
Yu et al.

(10) Patent No.: US 10,943,867 B2
(45) Date of Patent: *Mar. 9, 2021

(54) SCHEMES FOR FORMING BARRIER LAYERS FOR COPPER IN INTERCONNECT STRUCTURES

(71) Applicant: Taiwan Semiconductor Manufacturing Company, Ltd., Hsinchu (TW)

(72) Inventors: Chen-Hua Yu, Hsinchu (TW); Hai-Ching Chen, Hsinchu (TW); Tien-I Bao, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/450,788

(22) Filed: Jun. 24, 2019

(65) Prior Publication Data

US 2019/0311993 A1 Oct. 10, 2019

Related U.S. Application Data

(60) Division of application No. 15/860,014, filed on Jan. 2, 2018, now Pat. No. 10,332,838, which is a division
(Continued)

(51) Int. Cl.
*H01L 21/40* (2006.01)
*H01L 21/768* (2006.01)
*H01L 23/532* (2006.01)
*H01L 21/322* (2006.01)
*H01L 23/528* (2006.01)

(52) U.S. Cl.
CPC ...... *H01L 23/53238* (2013.01); *H01L 21/322* (2013.01); *H01L 21/76843* (2013.01); *H01L 21/76849* (2013.01); *H01L 21/76867* (2013.01); *H01L 21/76877* (2013.01);
(Continued)

(58) Field of Classification Search
None
See application file for complete search history.

(56) References Cited

U.S. PATENT DOCUMENTS 5,447,887 A  9/1995  Filipiak et al.
5,892,285 A  4/1999  Gonzalez et al.
(Continued)

OTHER PUBLICATIONS

Awaya et al., "Self-Aligned Passivation Technology for Copper Interconnection Using Copper-Aluminum Alloy," Jpn. J.Appl. Phys., Mar. 1997, vol. 36, Part 1, pp. 1548-1553.
(Continued)

*Primary Examiner* — Asok K Sarkar
(74) *Attorney, Agent, or Firm* — Slater Matsil, LLP

(57) ABSTRACT

A method of forming a semiconductor structure includes providing a substrate; forming a low-k dielectric layer over the substrate; embedding a conductive wiring into the low-k dielectric layer; and thermal soaking the conductive wiring in a carbon-containing silane-based chemical to form a barrier layer on the conductive wiring. A lining barrier layer is formed in the opening for embedding the conductive wiring. The lining barrier layer may comprise same materials as the barrier layer, and the lining barrier layer may be recessed before forming the barrier layer and may contain a metal that can be silicided.

20 Claims, 4 Drawing Sheets

Related U.S. Application Data of application No. 14/841,346, filed on Aug. 31, 2015, now Pat. No. 9,881,871, which is a continuation of application No. 14/263,842, filed on Apr. 28, 2014, now Pat. No. 9,129,968, which is a continuation of application No. 13/890,981, filed on May 9, 2013, now Pat. No. 8,729,703, which is a continuation of application No. 13/551,500, filed on Jul. 17, 2012, now Pat. No. 8,440,564, which is a division of application No. 13/115,161, filed on May 25, 2011, now Pat. No. 8,232,201, which is a division of application No. 11/602,808, filed on Nov. 21, 2006, now Pat. No. 7,964,496.

(52) U.S. Cl.
CPC ...... *H01L 21/76883* (2013.01); *H01L 23/528* (2013.01); *H01L 2924/0002* (2013.01)

(56) References Cited

U.S. PATENT DOCUMENTS

| | | | |
|---|---|---|---|
| 6,130,157 | A | 10/2000 | Liu et al. |
| 6,150,270 | A | 11/2000 | Matsuda et al. |
| 6,181,013 | B1 | 1/2001 | Liu et al. |
| 6,211,084 | B1 | 4/2001 | Ngo et al. |
| 6,271,135 | B1 | 8/2001 | Palmans et al. |
| 6,599,827 | B1 | 7/2003 | Ngo et al. |
| 6,600,634 | B1 | 7/2003 | Kim et al. |
| 6,809,029 | B2 | 10/2004 | Nogami et al. |
| 6,867,135 | B1 | 3/2005 | Bao et al. |
| 7,157,380 | B2 | 1/2007 | Dubin et al. |
| 7,348,672 | B2 | 3/2008 | Chen et al. |
| 7,524,755 | B2 | 4/2009 | Widodo et al. |
| 7,553,752 | B2 | 6/2009 | Kuan et al. |
| 7,964,496 | B2 | 6/2011 | Yu et al. |
| 8,058,692 | B2 | 11/2011 | Lai et al. |
| 8,232,201 | B2 | 7/2012 | Yu et al. |
| 8,440,564 | B2 | 5/2013 | Yu et al. |
| 8,729,703 | B2 | 5/2014 | Yu et al. |
| 9,129,968 | B2 | 9/2015 | Yu et al. |
| 2005/0136654 | A1 | 6/2005 | Cheng et al. |
| 2007/0037388 | A1 | 2/2007 | Hohage et al. |
| 2007/0123044 | A1 | 5/2007 | Hohage et al. |
| 2007/0228571 | A1 | 10/2007 | Yu et al. |
| 2012/0282768 | A1 | 11/2012 | Yu et al. |
| 2014/0231999 | A1 | 8/2014 | Yu et al. |

OTHER PUBLICATIONS

Colgan, "Selective CVD-W for Capping Damascene Cu Lines," Thin Solid Films, Elsevier Science S.A., 1995, vol. 262, pp. 120-123.

Ko et al., "High Performance/Reliability Cu Interconnect with Selective CoWP Cap," 2003 Symposium on VLSI Technology Digest of Technical Papers, 2003, pp. 109-110.

Krishnan et al., "Copper Metallization for VLSI Applications," VMIC Conference, Jun. 9-10, 1992, pp. 226-331.

SCHEMES FOR FORMING BARRIER LAYERS FOR COPPER IN INTERCONNECT STRUCTURES

PRIORITY CLAIM AND CROSS-REFERENCE

This application is a divisional of U.S. patent application Ser. No. 15/860,014, filed Jan. 2, 2018, entitled "Schemes for Forming Barrier Layers for Copper in Interconnect Structures," which is a divisional of U.S. patent application Ser. No. 14/841,346, entitled "Schemes for Forming Barrier Layers for Copper in Interconnect Structures," filed on Aug. 31, 2015, now U.S. Pat. No. 9,881,871, entitled "Schemes for Forming Barrier Layers for Copper in Interconnect Structures," issued on Jan. 30, 2018, which is a continuation of U.S. patent application Ser. No. 14/263,842, entitled "Schemes for Forming Barrier Layers for Copper in Interconnect Structures," filed on Apr. 28, 2014, now U.S. Pat. No. 9,129,968, issued on Sep. 8, 2015, which is a continuation of U.S. patent application Ser. No. 13/890,981, entitled "Schemes for Forming Barrier Layers for Copper in Interconnect Structures," filed on May 9, 2013, now U.S. Pat. No. 8,729,703, issued on May 20, 2014, which is a continuation of U.S. patent application Ser. No. 13/551,500 entitled "Schemes for Forming Barrier Layers for Copper in Interconnect Structures," filed on Jul. 17, 2012, now U.S. Pat. No. 8,440,564, issued on May 14, 2013, which is a divisional of U.S. patent application Ser. No. 13/115,161, entitled "Schemes for Forming Barrier Layers for Copper in Interconnect Structures," filed on May 25, 2011, now U.S. Pat. No. 8,232,201, issued on Jul. 31, 2012, which is a divisional of U.S. patent application Ser. No. 11/602,808, entitled "Schemes for Forming Barrier Layers for Copper in Interconnect Structures," filed on Nov. 21, 2006, now U.S. Pat. No. 7,964,496, issued on Jun. 21, 2011, which applications are incorporated herein by reference.

TECHNICAL FIELD

This invention is related generally to integrated circuits, and more particularly to the structure and methods of interconnect structures in integrated circuits, and even more particularly to the formation of barrier layers on copper features.

BACKGROUND

A conventional integrated circuit contains a plurality of patterns of metal lines separated by inter-wiring spacings and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of such type, according to current technology, may comprise eight or more levels of metallization layers to satisfy device geometry and micro-miniaturization requirements.

A commonly used method for forming metal lines and vias is known as "damascene." Generally, this process involves forming an opening in the dielectric interlayer, which separates the vertically spaced metallization layers. The opening is typically formed using conventional lithographic and etching techniques. After an opening is formed, the opening is filled with copper or copper alloys to form a via or a trench. Excess metal material on the surface of the dielectric interlayer is then removed by chemical mechanical polishing (CMP).

Copper has replaced aluminum to form metal lines because of its lower resistivity. However, copper suffers from electro-migration (EM) and stress-migration (SM) reliability issues as geometries continue to shrink and current densities increase.

FIG. 1 illustrates a cross-sectional view of a conventional interconnect structure 1 formed using damascene processes. Metal lines 2 and 4, which are typically formed of copper or copper alloys, are interconnected by via 10. Inter-metal-dielectric (IMD) 8 separates the two layers where metal lines 2 and 4 are located. Etch stop layer (ESL) 5 is formed on copper line 2. Diffusion barrier layers 12 and 14, which typically comprise Ta or TaN, are formed to prevent copper from diffusing into surrounding materials. ESL 5 typically has a higher dielectric constant (k value) than low-k dielectric layer 6 and IMD 8. As a result, the parasitic capacitances between the metal lines are undesirably increased.

FIG. 2 illustrates an alternative interconnect structure 3. Metal cap 16 is formed on copper line 2. Metal cap 16 is typically formed of materials not prone to electro-migration and stress-migration. This layer improves the reliability of the interconnect structure by reducing copper surface migration. It has been found that under stressed conditions, the mean time to failure (MTTF) of interconnect structure 3 is significantly longer than that of interconnection structure 1. With metal cap 16, the stress-induced void formation is also significantly reduced. Additionally, the parasitic capacitances are also reduced.

Since metal cap 16 is typically formed only on copper line 2, weak points exist at the interface of metal cap 16 and diffusion barrier layer 14, and copper may still diffuse out from these weak points.

Alternatively, metal cap 16 may be formed by soaking copper in silane ($SiH_4$) in a thermal and non-plasma ambient. Copper silicide is thus formed on the surface of copper line 2. A drawback of such a scheme is that during silane soaking, silicon in the silane will diffuse deep into copper line 2, causing copper silicide's formation deeply in copper line 2. As a result, the resistivity of copper line 2 is increased. The problem becomes worse when advanced technologies are used to form integrated circuits, and thus the thickness of copper line 2 is reduced.

The conventional schemes for forming cap layers have advantageous features and disadvantageous features, and thus may be used accordingly for different design requirements. To satisfy different design requirements and improve the reliability of integrated circuits, more methods for forming cap layers on copper lines are needed.

SUMMARY OF THE INVENTION

In accordance with one aspect of the present invention, a method of forming a semiconductor structure includes providing a substrate; forming a low-k dielectric layer over the substrate; embedding a conductive wiring into the low-k dielectric layer; and thermal soaking the conductive wiring in a carbon-containing silane-based chemical to form a barrier layer on the conductive wiring.

In accordance with another aspect of the present invention, a method of forming a semiconductor structure includes providing a substrate; forming a low-k dielectric layer over the substrate; forming an opening extending from a top surface of the low-k dielectric layer into the low-k dielectric layer; forming a first barrier layer lining the opening; embedding a conductive wiring into a remaining portion of the opening; recessing a top edge of the first barrier layer to form a recess, wherein portions of sidewalls of the conductive wiring are exposed; and forming a second barrier layer covering a top surface and exposed sidewalls of the conductive wiring.

In accordance with yet another aspect of the present invention, a method of forming a semiconductor structure includes providing a substrate; forming a low-k dielectric layer over the substrate; forming an opening extending from a top surface of the low-k dielectric layer into the low-k dielectric layer; forming a first barrier layer lining the opening; embedding a conductive wiring into a remaining portion of the opening; and forming a second barrier layer covering exposed portions of the conductive wiring, wherein the second barrier layer comprises substantially same materials as the first barrier layer, and wherein the second barrier layer is formed on the top edges of the first barrier layer.

In accordance with yet another aspect of the present invention, a method of forming a semiconductor structure includes providing a substrate; forming a low-k dielectric layer over the substrate; forming an opening extending from a top surface of the low-k dielectric layer into the low-k dielectric layer; forming a first barrier layer lining the opening, wherein the first barrier layer comprises a metal selected from the group consisting essentially of cobalt, nickel, and combinations thereof; embedding a conductive wiring into a remaining portion of the opening; and thermal soaking a top surface of the conductive wiring in a silane-based chemical to form a second barrier layer on the conductive wiring and the top edges of the first barrier layer.

In accordance with yet another aspect of the present invention, a semiconductor structure includes a substrate; a low-k dielectric layer over the substrate, an opening extending from a top surface of the low-k dielectric layer into the low-k dielectric layer; a first barrier layer lining the opening, wherein top edges of the first barrier layer is recessed from a top surface of the low-k dielectric layer to form a recess; a conductive wiring in a remaining portion of the opening; and a second barrier layer covering a top surface of the conductive wiring and extending into the recess.

In accordance with yet another aspect of the present invention, a semiconductor structure includes a substrate; a low-k dielectric layer over the substrate; an opening extending from a top surface of the low-k dielectric layer into the low-k dielectric layer; a first barrier layer lining the opening; a conductive wiring in a remaining portion of the opening; and a second barrier layer on the conductive wiring and top edges of the first barrier layer, wherein portions of the second barrier layer directly on the top edges of the first barrier layer comprise a silicide formed from the first barrier layer.

In accordance with yet another aspect of the present invention, a semiconductor structure includes a substrate; a low-k dielectric layer over the substrate; an opening extending from a top surface of the low-k dielectric layer into the low-k dielectric layer; a first barrier layer lining the opening; a conductive wiring in a remaining portion of the opening; and a second barrier layer on the conductive wiring, wherein the second barrier layer comprises substantially same materials as the first barrier layer, and wherein the second barrier layer is formed on the top edges of the first barrier layer.

In accordance with yet another embodiment, a method of forming a semiconductor structure is provided, the method comprising providing a substrate and forming a low-k dielectric layer over the substrate. An opening is formed extending from a top surface of the low-k dielectric layer into the low-k dielectric layer and a first barrier layer is formed lining the opening. A conductive wiring is embedded in a remaining portion of the opening, and a top edge of the first barrier layer is recessed to form a recess, wherein portions of sidewalls of the conductive wiring are exposed. A second barrier layer is formed covering a top surface and exposed sidewalls of the conductive wiring.

In accordance with yet another embodiment, a method of forming a semiconductor structure is provided, the method comprising forming an opening into a low-k dielectric layer over a substrate, the opening extending from a top surface of the low-k dielectric layer into the low-k dielectric layer, and forming a first barrier layer lining the opening. A conductive wiring is embedded in a remaining portion of the opening, and a second barrier layer is plated to cover exposed portions of the conductive wiring and the first barrier layer, wherein the second barrier layer comprises substantially same materials as the first barrier layer.

In accordance with yet another embodiment, a method of forming a semiconductor structure is provided, the method comprising forming an opening in a dielectric layer and forming a barrier layer within the opening. A conductive material is formed within the opening and a portion of the barrier layer is removed to expose a sidewall of the conductive material. The conductive material and the barrier layer are thermal soaked in a carbon-containing silane-based process gas to form a silicide layer over the conductive material, over the barrier layer, and along the sidewall.

In accordance with yet another embodiment, a method of manufacturing a semiconductor device comprising depositing a low-k dielectric layer over a substrate and removing a portion of the low-k dielectric layer to form an opening in the low-k dielectric layer, the opening comprising sidewalls, is provided. A barrier layer is deposited along the sidewalls of the opening, the barrier layer comprising a top edge facing away from the substrate, and the opening is filled with a conductive material. A cap layer is plated on the conductive material and the top edge, the cap layer and the barrier layer comprising substantially the same materials.

In accordance with yet another embodiment, a method of manufacturing a semiconductor device comprising depositing a dielectric material over a substrate, the dielectric material comprising a low-k dielectric material and etching the dielectric material to form an opening into the dielectric material, the opening comprising sidewalls, is provided. The sidewalls are lined with a first barrier material, the first barrier material having a top surface parallel with the substrate, and the opening is filled with a conductive material after the lining the sidewalls with the barrier material. A second barrier material is plated over the top surface of the first barrier material and over the conductive material, the first barrier material and the second barrier material being substantially the same.

In accordance with yet another embodiment, a method of forming a semiconductor structure comprising depositing a low-k dielectric layer on a substrate and patterning the low-k dielectric layer to form an opening, the opening comprising sidewalls and a bottom, is provided. A barrier layer is deposited along the sidewalls and the bottom of the opening, and the opening is filled with a conductive material after the depositing the barrier layer. A cap layer is formed over the barrier layer and the conductive material, wherein the cap layer and the barrier layer comprise substantially the same material and the cap layer does not extend over the low-k dielectric layer.

In accordance with yet another embodiment, a method of forming a semiconductor structure comprising lining an opening in a low-k dielectric layer with a first barrier material is provided. The opening is filled with a conductive material, wherein the conductive material has a planar top surface after the filling the opening, and a second barrier material is plated onto exposed regions of the first barrier material and the conductive material, the second barrier material and the first barrier material being substantially the same material.

In accordance with yet another embodiment, a semiconductor structure comprising a dielectric layer over a substrate and an opening extending from a top surface of the dielectric layer into the dielectric layer is provided. A first barrier layer is lining the opening and a conductive wiring is in a remaining portion of the opening, wherein a top edge of the first barrier layer is recessed from at least a portion of a sidewall of the conductive wiring. A second barrier layer is covering a top surface and the portion of the sidewall of the conductive wiring, wherein the second barrier layer does not extend over the dielectric layer.

In accordance with yet another embodiment, a semiconductor device comprising a conductive material embedded within a dielectric layer over a substrate, the conductive material being planar with the dielectric layer, is provided. A first barrier layer is between the conductive material and the dielectric layer, the first barrier layer being non-planar with the conductive material such that a first sidewall of the conductive material facing the dielectric layer is uncovered by the first barrier layer. A second barrier layer different from the first barrier layer, wherein the second barrier layer covers the first sidewall and covers a top surface of the conductive material but not a top surface of the dielectric layer.

In accordance with yet another embodiment, a semiconductor device comprising a dielectric layer over a substrate and a conductive wire embedded within the dielectric layer, the conductive wire comprising a conductive material, is provided. A first barrier layer is between the dielectric layer and the conductive wire, and a capping layer over the conductive wire, the capping layer comprising the conductive material and a carbon-containing silane derivative.

In accordance with yet another embodiment, a semiconductor device is provided. The semiconductor device includes a conductive material embedded within a dielectric layer, the conductive material comprising a first element, and a first barrier layer lining sidewalls and a bottom surface of the conductive material, the first barrier layer including a second element different from the first element. The semiconductor device further includes a capping layer over the conductive material and the first barrier layer but not extending over the dielectric layer. The capping layer includes a first material in physical contact with the conductive material, wherein the first material includes the first element and a third element, the third element being different from the first element and the second element, and a second material in physical contact with the first barrier layer, wherein the second material includes the second element and the third element.

In accordance with yet another embodiment, a semiconductor device is provided. A semiconductor device includes a conductive material extending into a dielectric layer, the conductive material including a first element, and a first barrier layer lining sidewalls of the conductive material, the first barrier layer including a second element different from the first element. The semiconductor device further includes a second barrier layer over the conductive material and the first barrier layer. The second barrier layer includes a first region in physical contact with the conductive material, the first region including a silicide of the first element, the first region having a first thickness, and a second region in physical contact with the first barrier layer, the second region including a silicide of the second element, the second region having a second thickness different from the first thickness.

In accordance with yet another embodiment, a method is provided. A method includes forming a low-k dielectric layer over a substrate. A conductive wiring is embedded in the low-k dielectric layer. The conductive wiring is thermal soaked in a gas with SiH-bonds to form a barrier layer on the conductive wiring. The thermal soaking occurs in a non-plasma environment. The barrier layer includes a silicide.

In accordance with yet another embodiment, a method is provided. The method includes embedding a conductive material in a low-k dielectric layer. The conductive material includes a first element. The conductive material is thermal soaked in a gas with SiH-bonds to form a barrier layer on the conductive material. The thermal soaking occurs in a non-plasma environment. The barrier layer includes a silicide of the first element. A plasma process is performed to passivate the barrier layer.

In accordance with yet another embodiment, a method is provided. The method includes forming a first recess in a low-k dielectric layer. A first barrier layer is formed on sidewalls and a bottom of the first recess. The first barrier layer includes a first element. The first recess is filled with a conductive material. The conductive material includes a second element different from the first element. A decontamination process is performed on the conductive material. The conductive material is thermal soaked in a gas with SiH-bonds to form a second barrier layer on the conductive material and the first barrier layer. Thermal soaking occurs in a non-plasma environment. The second barrier layer includes a silicide of the first element and a silicide of the second element. A passivation process is performed on the second barrier layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The schemes of interconnect structures for integrated circuits and methods of forming the same are provided. The intermediate stages of manufacturing preferred embodiments of the present invention are illustrated. Throughout the various views and illustrative embodiments of the present invention, like reference numbers are used to designate like elements. In the following discussed embodiments, single damascene processes are discussed. One skilled in the art will realize that the teaching is readily available for dual damascene processes.

Figure 1:
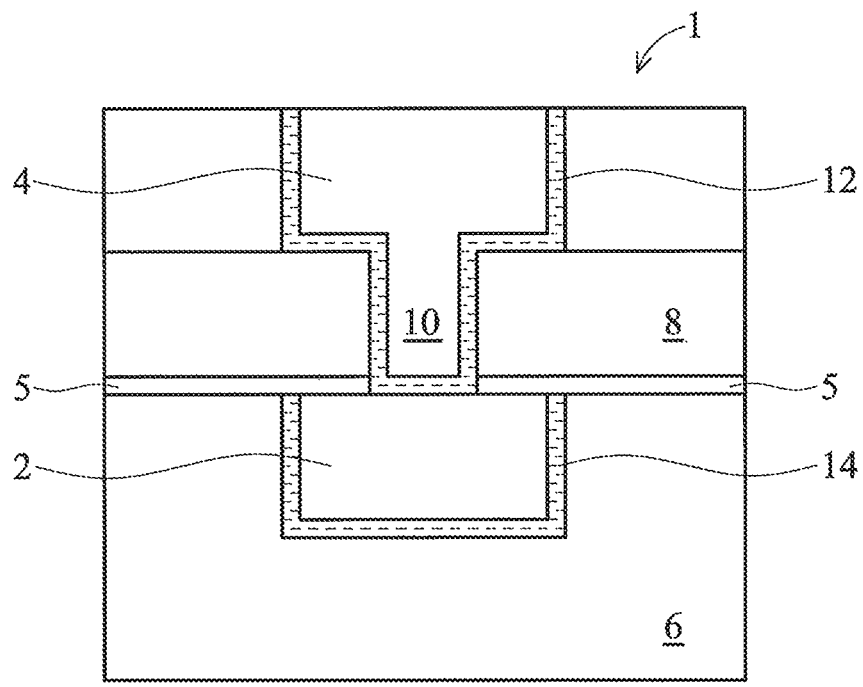
FIG. 1 illustrates a conventional interconnect structure, wherein a copper line is covered by an etch stop layer.
Figure 2:
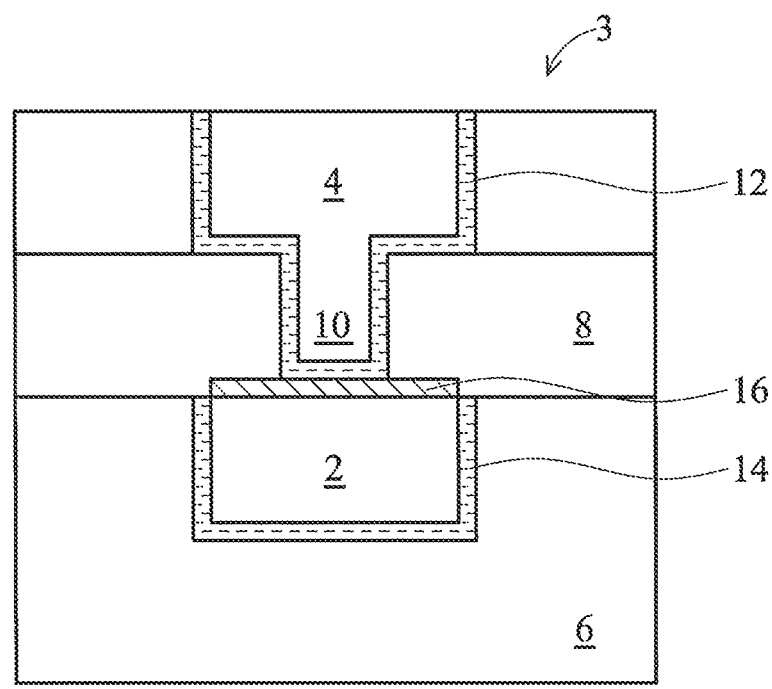
FIG. 2 illustrates a conventional interconnect structure, wherein a copper line is covered by a metal cap.
Figure 3:
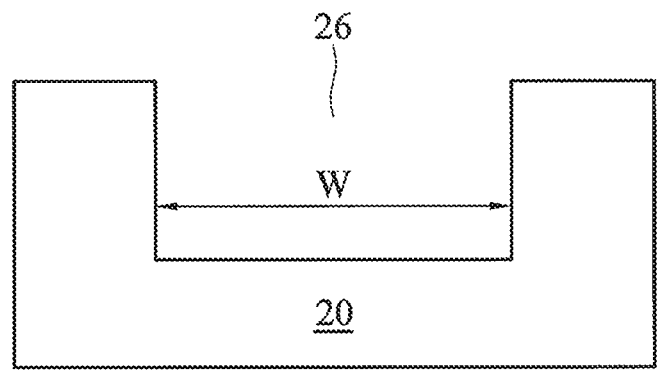
FIGS. 3 through 5 are cross-sectional views of intermediate stages in the manufacture of a first embodiment of the present invention, wherein a barrier layer is formed on a copper feature by thermal soaking.
Figure 4:
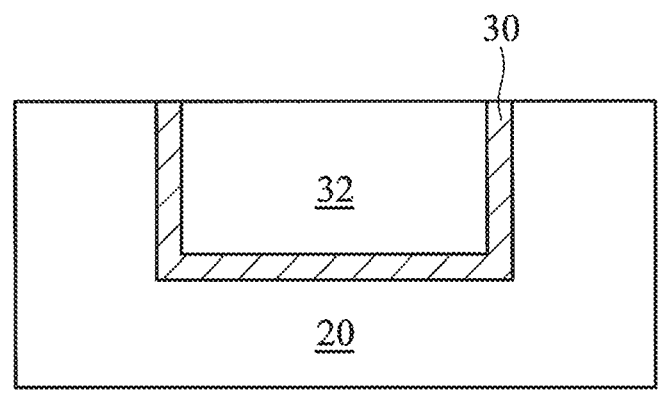
Figure 5:
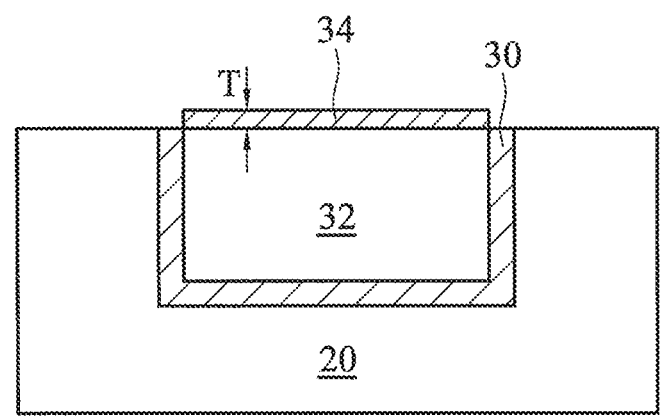

FIGS. 3 through 5 are cross-sectional views of intermediate stages in the making of a first embodiment of the present invention. FIG. 3 illustrates the formation of opening 26 in dielectric layer 20. As is known in the art, dielectric layer 20 is formed over a substrate (not shown), which may be a single crystalline or a compound semiconductor substrate. Active devices (not shown) such as transistors may be formed on the semiconductor substrate. Opening 26 may be a via opening, which is for forming a via, or a trench, which is for forming a metal line. The width W of opening 26 is preferably less than about 50 nm. In an exemplary embodiment, dielectric layer 20 has a low dielectric constant value (k value), preferably lower than about 3.0, hence is referred to as low-k dielectric layer 20 throughout the description. Low-k dielectric layer 20 may include commonly used low-k dielectric materials such as carbon-containing dielectric materials, and may further contain nitrogen, hydrogen, oxygen, and combinations thereof. Low-k dielectric layer 20 is preferably porous.

FIG. 4 illustrates the formation of diffusion barrier layer 30 lining opening 26 and conductive line 32 in opening 26. Throughout the description, diffusion barrier layer 30 is alternatively referred to as a barrier layer or a lining barrier layer. Barrier layer 30 preferably includes titanium, titanium nitride, tantalum, tantalum nitride, or other alternatives. Barrier layer 30 may be formed using physical vapor deposition (PVD) or one of the chemical vapor deposition (CVD) methods. The thickness of barrier layer 30 may be between about 20 Å and about 200 Å. One skilled in the art will realize, however, that the dimensions recited throughout the description are related to the formation technology used for forming the integrated circuits, and will reduce with the scaling of the formation technology.

The material of conductive line 32 is preferably copper or a copper alloy. Throughout the description, conductive line 32 is alternatively referred to as copper line 32, although it may comprise other conductive materials, such as silver, gold, tungsten, aluminum, and the like. As is known in the art, the steps for forming barrier layer 30 and copper line 32 may include blanket forming barrier layer 30, depositing a thin seed layer of copper or copper alloy, and filling opening 26 with a conductive material, preferably by plating. A chemical mechanical polish (CMP) is then performed to remove excess barrier layer 30 and the conductive material on low-k dielectric layer 20, leaving barrier layer 30 and copper line 32 only in opening 26.

An optional pretreatment is then performed to treat the surface of copper line 32. In the preferred embodiment, the pretreatment includes a hydrogen-based gas environment in a production tool, such as one used for plasma enhanced chemical vapor deposition (PECVD). The hydrogen-based gases preferably include $H_2$, $NH_3$, $CH_4$, and the like. In alternative embodiments, the pretreatment is performed in a nitrogen-based gas environment, which contains nitrogen-containing gases, for example, $N_2$, $NH_3$, and the like. The pretreatment has the function of removing oxygen and possibly some chemical contamination from copper line 32.

FIG. 5 illustrates the formation of barrier layer 34, often referred to as metal cap 34, on copper line 32. In one embodiment, the structure as shown in FIG. 4 is thermal soaked in a carbon-containing silane-based soaking gas, such as tri-methyl-silane ($SiH(CH_3)_3$, also referred to as 3MS, wherein the thermal soaking occurs in an environment (ambient) at an elevated temperature, for example, about 300° C. and higher. Preferably, plasma is not turned on, although in alternative embodiments, plasma may be turned on. In an exemplary embodiment, the temperature of the ambient is between about 150° C. and about 450° C., and the pressure of the soaking gas is between about 10 mtorr and about 1000 mtorr. In alternative embodiments, the carbon-containing silane-based soaking gas may contain methyl-silane ($SiH_3(CH_3)_1$, also referred to as 1 MS), di-methyl-silane ($SiH_2(CH_3)_2$, also referred to as 2 MS), 3 MS, and combinations thereof. Tetra-methy-silane (4 MS) is generally not preferred. In yet other embodiments, the soaking gas may contain other gases with SiH-bonds. In the thermal environment, the soaking gas reacts with copper to form copper silicide, hence barrier layer 34 is formed on copper line 32. One skilled in the art will perceive that thickness T of barrier layer 34 is related to the temperature and soaking duration. In an exemplary embodiment, the soaking duration is between about 1 second and about 5 minutes. Accordingly, thickness T is between about 50 Å and about 200 Å.

There may be dangling bonds on the surface of barrier layer 34, which may be removed by an additional plasma treatment. Preferably, nitrogen-containing gases, such as $NH_3$, and/or carbon-containing gases, for example, methyl ($CH_3$) containing gases, such as $C_xH_y$, may be used, wherein x and y indicate an atomic ratio of carbon to hydrogen. The treatment will connect the dangling bonds with nitrogen-containing and/or carbon-containing terminals, and thus passivates barrier layer 34.

An advantageous feature of the embodiment shown in FIG. 5 is that during the thermal soaking of copper line 32 in 1 MS, 2 MS and/or 3 MS, the carbon in these materials will prevent silicon diffusing into deep portions of copper line 32. Accordingly, copper silicide is formed only at the surface portion of the copper line 32, avoiding the excess resistance degradation of copper line 32.

Figure 6:
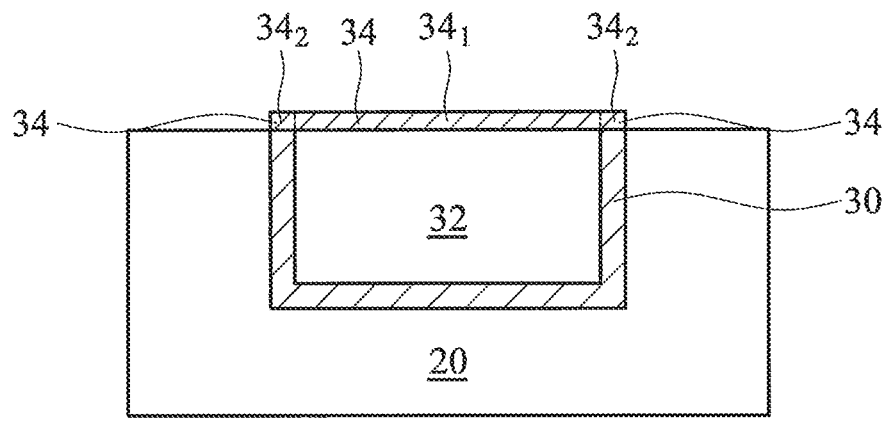
FIG. 6 illustrates a cross-sectional view of a second embodiment of the present invention, wherein in addition to silicide formed on a copper line, silicide is also formed on the top edges of a lining barrier layer.

FIG. 6 illustrates a cross-sectional view of a second embodiment of the present invention. In this embodiment, the initial structure is similar to the structure as shown in FIG. 4, except that barrier layer 30 comprises a metal that can be silicided. In an exemplary embodiment, barrier layer 30 comprises a cobalt-containing material including CoP, CoB, CoWP, CoWB, or the like. In other embodiments, barrier layer 30 comprises nickel. Barrier layer 34 may be formed using essentially the same thermal soaking method as discussed in the first embodiment. Alternatively, barrier layer 34 is formed by soaking the wafer, on which the barrier layer 30 and copper line 32 are formed, in silane. In an exemplary embodiment, the wafer is placed in an ambient filled with silane gas, wherein the temperature of the ambient is between about 100° C. and about 450° C., and the pressure of the soaking gases is between about 1 mtorr and about 10 torr. Plasma is generally not desired, although it may be turned on.

During the thermal soaking, copper silicide is formed on the surface of copper line 32. At the same time, the metal in diffusion barrier layer 30 also reacts with silicon to form silicide. As a result, region $34_1$ of barrier layer 34 comprises copper silicide, while regions $34_2$ comprises the silicide of metals in barrier layer 30. Therefore, the interfaces between barrier layers 30 and 34 are sealed. In an exemplary embodiment, both portions $34_1$ and $34_2$ of barrier layer 34 have a thickness of between about 5 Å and about 100 Å. One skilled in the art will realize, however, that the portions $34_1$ and $34_2$ may have different thicknesses due to the different silicidation rates between copper and the metals in copper line 32 and barrier layer 30.

Figure 7:
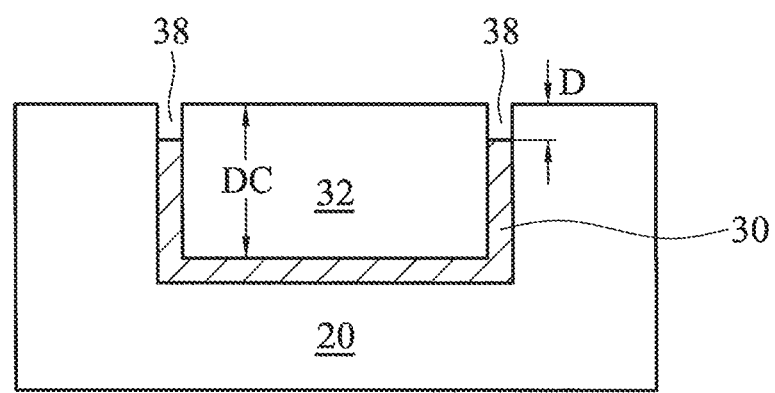
FIGS. 7 and 8 are cross-sectional views of intermediate stages in the manufacture of a third embodiment of the present invention, wherein a barrier layer on a copper line extends into a recess of a lining barrier layer.
Figure 8:
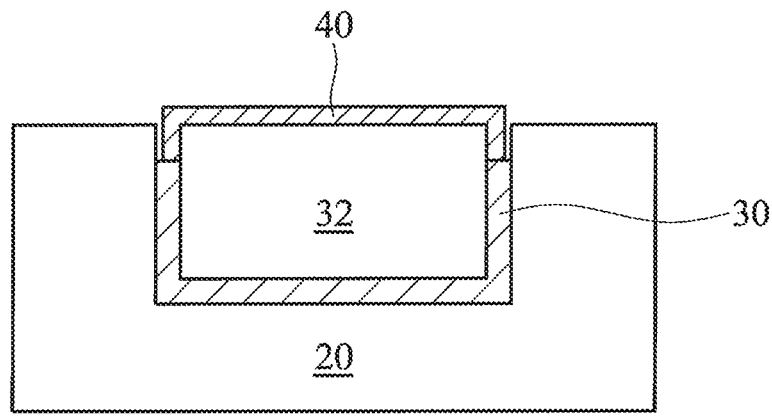

FIGS. 7 and 8 illustrate cross-sectional views of intermediate stages of a third embodiment of the present invention. In this embodiment, the initial structure is similar to the structure as shown in FIG. 4, with barrier layer 30 formed of essentially the same material as in the first embodiment. In an exemplary embodiment, barrier layer 30 includes titanium, titanium nitride, tantalum, tantalum nitride, or other alternatives. Alternatively, barrier layer 30 comprises a metal that can be silicided, such as cobalt and/or nickel.

Referring to FIG. 7, after copper line 32 is formed, an etching is performed using an etchant that attacks diffusion barrier layer 30, but not copper line 32 and low-k dielectric layer 20. Recesses 38 are thus formed. In an exemplary embodiment, recesses 38 have a depth D of greater than about 50 Å. Depth D is also preferably greater than about 5 percent of thickness DC of copper line 32.

An optional treatment may be performed to clean surface of copper line 32 using either thermal or plasma treatment, wherein the details of the treatment may be essentially the same as discussed in the first embodiment. After the optional treatment, barrier layer 40 is formed covering top surface and sidewalls of copper line 32, as illustrate in FIG. 8. Diffusion barrier layer 40 may comprise CoP, CoB, CoWP, CoWB, NiWP, CoSnP, NiWB, CuSi, ZrN, NiMoP, and combinations thereof. In an exemplary embodiment, barrier layer 40 is plated using, for example, electrochemical plating. Alternatively, barrier layer 40 is formed by thermal soaking in either a soaking gas containing 1 MS, 2 MS, 3 MS, and combinations thereof, or thermal soaking in silane. The details of thermal soaking have been discussed in the preceding paragraphs, and thus are not repeated herein. Accordingly, barrier layer 40 comprises copper silicide. If diffusion barrier layer 30 contains cobalt and/or nickel, a portion of barrier layer 40 on the top edges of barrier layer 30 may contain cobalt silicide and/or nickel silicide. By forming recesses 38, the weak points between barrier layers 30 and 40 are eliminated.

Figure 9:
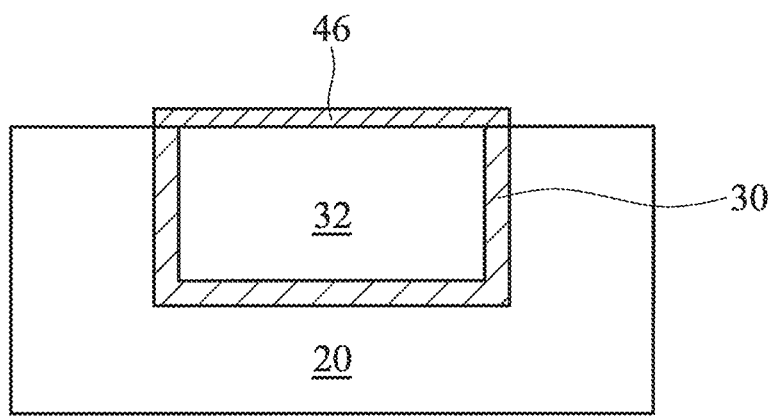
FIG. 9 illustrates a cross-sectional view of a fourth embodiment, wherein a barrier layer formed on a copper line comprises substantially same materials as a lining barrier layer, and thus the barrier layer is also formed on the lining barrier layer.

FIG. 9 illustrates an intermediate stage of a fourth embodiment of the present invention. In this embodiment, the initial structure is similar to the structure as shown in FIG. 4, wherein barrier layer 30 can be formed of any commonly used barrier materials, such as Ta, TaN, Ti, TiN, cobalt-containing material such as CoP, CoB, CoWP, CoWB, nickel-containing material such as NiWP, CoSnP, NiWB, CuSi, ZrN, NiMoP, and combinations thereof. Barrier layer 46 is formed on both copper line 32 and diffusion barrier layer 30. In the preferred embodiment, diffusion barrier layer 46 contains a substantially same material as diffusion barrier layer 30. It is to be noted that the term "substantially same" is a term of art. If barrier layers 30 and 46 have same types of elements in substantially same concentrations, they are considered to be substantially the same. Furthermore, if diffusion barrier layers 30 and 46 have over about 70 percent materials in common, they are considered to be substantially the same, even though they may comprise additional different types of materials. In an exemplary embodiment, barrier layer 46 is formed by electroless plating. Because diffusion barrier layer 30 comprises substantially same materials as diffusion barrier layer 46, diffusion barrier layer 46 can be formed on the top edges of the barrier layer 30 during plating deposition of the diffusion barrier layer 46. Otherwise, diffusion barrier layer 46 will not be formed on the top edges of barrier layer 30. For instance, if diffusion barrier layer 30 is a TaN layer and diffusion barrier layer 46 is a CoWP or a NiWP layer, then CoWP or NiWP will not be formed on top edges of barrier layer 30. The thickness of diffusion barrier layer 46 may be between about 20 Å and about 200 Å.

With barrier layer 46 extending on the top edges of barrier layer 30, a better sealing of copper line 32 is achieved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
forming a low-k dielectric layer over a substrate;
embedding a conductive wiring in the low-k dielectric layer; and
thermal soaking the conductive wiring in a gas with SiH-bonds to form a barrier layer on the conductive wiring, wherein the thermal soaking occurs in a non-plasma environment, wherein the barrier layer extends along a top surface of the conductive wiring, wherein the barrier layer comprises a silicide, and wherein a width of the barrier layer is greater than a width of the conductive wiring.

2. The method of claim 1, further comprising performing a decontamination process prior to the thermal soaking the conductive wiring.

3. The method of claim 2, wherein the decontamination process is performed at least in part in a hydrogen-based gas environment.

4. The method of claim 1, further comprising passivating the barrier layer after the thermal soaking the conductive wiring.

5. The method of claim 4, wherein the passivating the barrier layer is performed at least in part with a plasma treatment.

6. The method of claim 5, wherein the passivating the barrier layer is performed with a carbon-containing gas.

7. A method comprising:
embedding a conductive material in a low-k dielectric layer, the conductive material comprising a first element;
thermal soaking the conductive material in a gas with SiH-bonds to form a barrier layer on the conductive material, wherein the thermal soaking occurs in a non-plasma environment, wherein the barrier layer comprises a silicide of the first element, and wherein a topmost surface of the barrier layer is above a topmost surface of the low-k dielectric layer; and performing a plasma process to passivate the barrier layer.

8. The method of claim 7, further comprising performing a decontamination process prior to the thermal soaking the conductive material.

9. The method of claim 8, wherein the decontamination process removes oxygen and chemical contamination from the conductive material.

10. The method of claim 8, wherein the decontamination process is performed at least in part in a hydrogen-based gas environment.

11. The method of claim 8, wherein the decontamination process is performed at least in part in a nitrogen-based gas environment.

12. The method of claim 7, wherein the plasma process is performed using nitrogen-containing gases.

13. The method of claim 7, wherein the plasma process is performed using carbon-containing gases.

14. A method comprising:
forming a first recess in a low-k dielectric layer;
forming a first barrier layer on sidewalls and a bottom of the first recess, the first barrier layer comprising a first metallic element;
filling the first recess with a conductive material, the conductive material comprising a second metallic element different from the first metallic element;
performing a decontamination process on the conductive material;
thermal soaking the conductive material in a gas with SiH-bonds to form a second barrier layer on the conductive material and the first barrier layer, wherein the thermal soaking occurs in a non-plasma environment, and wherein the second barrier layer comprises a silicide of the first metallic element and a silicide of the second metallic element; and
performing a passivation process on the second barrier layer.

15. The method of claim 14, wherein the decontamination process is performed in a gas environment comprising $H_2$, $NH_3$, or $CH_4$.

16. The method of claim 14, wherein the decontamination process is performed in a gas environment comprising $N_2$ or $NH_3$.

17. The method of claim 14, wherein performing the passivation process comprises performing a plasma process using a $NH_3$ gas.

18. The method of claim 14, wherein performing the passivation process comprises performing a plasma process using a $C_xH_y$ gas.

19. The method of claim 14, further comprising, prior to the thermal soaking the conductive material, etching the first barrier layer to form a second recess.

20. The method of claim 19, wherein a depth of the second recess is greater than about 5% of a thickness of the conductive material.

\* \* \* \* \*